(12) United States Patent
Zhou et al.

(10) Patent No.: US 11,650,261 B2
(45) Date of Patent: May 16, 2023

(54) DETECTION APPARATUS OF ELECTROCHEMICAL IMPEDANCE SPECTROSCOPY AND BATTERY MANAGEMENT SYSTEM

(71) Applicant: CONTEMPORARY AMPEREX TECHNOLOGY CO., LIMITED, Ningde (CN)

(72) Inventors: Fangjie Zhou, Ningde (CN); Yizhen Hou, Ningde (CN); Xiyang Zuo, Ningde (CN); Qiandeng Li, Ningde (CN); Le Chu, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 17/562,079

(22) Filed: Dec. 27, 2021

(65) Prior Publication Data
US 2023/0064240 A1 Mar. 2, 2023

Related U.S. Application Data

(63) Continuation of application No. PCT/CN2021/114820, filed on Aug. 26, 2021.

(51) Int. Cl.
*G01R 31/389* (2019.01)
*G01N 27/02* (2006.01)
*G01R 31/392* (2019.01)

(52) U.S. Cl.
CPC ......... *G01R 31/389* (2019.01); *G01N 27/026* (2013.01); *G01R 31/392* (2019.01)

(58) Field of Classification Search
CPC .. G01R 31/389; G01R 31/392; G01N 27/026; G01N 33/48728; H01M 10/48; H01M 10/425; Y02E 60/10
(Continued)

(56) References Cited

U.S. PATENT DOCUMENTS

| 11,125,707 B1* | 9/2021 | Fasching | H01M 10/48 |
| 2004/0073390 A1* | 4/2004 | Wagner | G01N 27/026 |
| | | | 702/65 |

(Continued)

FOREIGN PATENT DOCUMENTS

| CN | 204789762 U | 11/2015 |
| CN | 108663631 A | 10/2018 |

(Continued)

OTHER PUBLICATIONS

International Search Report dated May 25, 2022 received in International Application No. PCT/CN2021/114820.
(Continued)

*Primary Examiner* — Lee E Rodak
*Assistant Examiner* — Trung Q Nguyen
(74) *Attorney, Agent, or Firm* — Scully, Scott, Murphy & Presser, P.C.

(57) ABSTRACT

Embodiments of the present application provide a detection apparatus of electrochemical impedance spectroscopy and a battery management system, the detection apparatus including a waveform generator, where the waveform generator is integrated in a battery monitoring chip; an excitation resistor; a detection resistor; and an MOS switch, wherein the waveform generator is configured to generate a pulse waveform, a gate electrode of the MOS switch is configured to receive the pulse waveform; the excitation resistor is configured to enable the battery to generate an excitation current when the gate electrode of the MOS switch receives the pulse waveform; the detection resistor is configured to convert the excitation current into an excitation voltage, the excitation voltage is configured to calculate an electrochemical impedance of the battery, The detection apparatus of electrochemical impedance spectroscopy in embodiments of the present application can lower cost and volume of EIS detection.

20 Claims, 7 Drawing Sheets

(58) Field of Classification Search
USPC ....... 324/400, 430–433, 500, 764.01, 103 R, 324/771, 761.01, 501, 600, 639, 642, 702, 324/76.11, 76.66, 96
See application file for complete search history.

(56) References Cited

U.S. PATENT DOCUMENTS

| | | | |
|---|---|---|---|
| 2011/0270559 A1* | 11/2011 | Christophersen | G01R 31/389 702/65 |
| 2018/0059191 A1 | 3/2018 | Qahouq | |

FOREIGN PATENT DOCUMENTS

| | | | | |
|---|---|---|---|---|
| CN | 110940926 A | * | 10/2018 | ............. G01R 27/02 |
| CN | 109459465 A | | 3/2019 | |
| CN | 108663631 A | * | 3/2020 | ........... G01R 31/389 |
| CN | 110940926 A | | 3/2020 | |

OTHER PUBLICATIONS

Koseoglou, M. et al., "A Novel On-Board Electrochemical Impedance Spectroscopy System for Real-Time Battery Impedance Estimation", IEEE Transactions on Power Electronics, Mar. 3, 2021, pp. 10776-10787, vol. 36, No. 9.

Christensen, A. et al., "Using on-board electrochemical impedance spectroscopy in battery management systems", World Electric Vehicle Symposium and Exhibition, Nov. 17, 2013, pp. 1-7.

Wu, C. et al., "A Flexible Real-Time Measurement and Control System for Enhanced In-Situ Battery Monitoring", IEEE 10th International Workshop on Applied Measurements for Power Systems, Sep. 25, 2019, pp. 1-6.

Extended European Search Report dated Dec. 7, 2022 received in European Patent Application No. EP 21819710.1.

* cited by examiner

DETECTION APPARATUS OF ELECTROCHEMICAL IMPEDANCE SPECTROSCOPY AND BATTERY MANAGEMENT SYSTEM

CROSS-REFERENCE TO RELATED APPLICATIONS

This application is a continuation of International Application No. PCT/CN2021/114820, filed on Aug. 26, 2021, the disclosure of which is hereby incorporated by reference in its entirety.

TECHNICAL FIELD

The present application relates to the technical field of batteries, and in particular, relates to a detection apparatus of electrochemical impedance spectroscopy and a battery management system.

BACKGROUND

An existing Battery Management System (BMS) of a new energy automobile or an energy storage system monitors a state of a battery mainly by monitoring physical parameters of a battery, such as a voltage, a temperature, a current, and then a state parameter of the battery, such as a state of charge (SOC), an aging degree or a state of health (SOH) or a direct current resistance (DCR), is calculated based on the parameters. For example, the SOC is calculated according to AH integral of current and aided with a voltage correction in a particular state. However, the method needs a complete charging and charging cycle to learn and determine a maximum battery capacity. Voltage correction generally needs to be determined at an end voltage of the battery. However, the end voltage relates to a current, a temperature, a direct current resistance and other factors at that time. Thus, calculating method is caused to be complicated and precision cannot be improved either.

Electrochemical impedance spectroscopy (EIS) is a response of an electrochemical system to an external excitation. It can be used to analyze internal resistance of the battery, electric-double-layer capacitance and faraday impedance etc. According to related studies and analysis, impedance spectroscopy of a battery presented under different state parameters is inconsistent. Therefore, state detection of the battery can be performed based on EIS detection.

Although the prior art is also capable of performing EIS detection on the battery, problems in high cost, large volume and complicated solution exist. Therefore, the prior art is generally used at a working station for studying and analysis of the battery, such that it is not advantageous to be applied to state detection in a using process of the battery.

SUMMARY

Embodiments of the present application provide a detection apparatus of electrochemical impedance spectroscopy and a battery management system, which can lower cost and volume of EIS detection, enabling it to be widely applied in a BMS.

A first aspect provides a detection apparatus of electrochemical impedance spectroscopy including a waveform generator, where the waveform generator is integrated in a battery monitoring chip; an excitation resistor; a detection resistor; and an MOS switch, where one of one end of the excitation resistor and one end of the detection resistor is connected to a positive electrode of a battery, the other of one end of the excitation resistor and one end of the detection resistor is connected to a negative electrode of the battery, one of the other end of the excitation resistor and the other end of the detection resistor is connected to a source electrode of the MOS switch, and the other of the other end of the excitation resistor and the other end of the detection resistor is connected to a drain electrode of the MOS switch; where the waveform generator is configured to generate a pulse waveform, a gate electrode of the MOS switch is configured to receive the pulse waveform, the excitation resistor is configured to enable the battery to generate an excitation current when the gate electrode of the MOS switch receives the pulse waveform, the detection resistor is configured to convert the excitation current into an excitation voltage, the excitation voltage is configured to calculate an electrochemical impedance of the battery, and electrochemical impedances of the battery under different frequencies are configured to form electrochemical impedance spectroscopy of the battery.

Injection of an excitation current is realized by the waveform generator in the battery monitoring chip, thereby smartly integrating an EIS detection apparatus in a chip architecture. Thus, cost and volume of EIS detection can be reduced, enabling it to be widely applied in the BMS and applied for state detection of the battery during a using process easier.

By combining the first aspect, in a first possible implementation of the first aspect, where the detection apparatus further includes an analog-to-digital converter being configured to sample the excitation voltage corresponding to the battery.

By employing the analog-to-digital converter, an analog signal is converted into a digital signal that can be processed by a processor, thus achieving the purpose of quantifying the electrochemical impedance of the battery.

By combining some implementations of the first aspect, in a second possible implementation of the first aspect, where each analog-to-digital converter of a plurality of the analog-to-digital converters is configured to sample the excitation voltage corresponding to a corresponding battery in a plurality of the batteries respectively, where the plurality of the analog-to-digital converters are in one-to-one correspondence to the plurality of the batteries.

By employing a plurality of analog-to-digital converters, excitation voltages corresponding to a plurality of batteries can be obtained simultaneously and electrochemical impedance spectroscopy of a plurality of batteries can be further obtained, thus improving detection efficiency.

By combining some implementations of the first aspect, in a third possible implementation of the first aspect, where the analog-to-digital converter is configured to sample a plurality of the excitation voltages in one-to-one correspondence to a plurality of the batteries.

By combining some implementations of the first aspect, in a fourth possible implementation of the first aspect, where the plurality of excitation voltages are channel-switched to the analog-to-digital converter for being sampled by a multiplexer.

A sharing analog-to-digital converter is employed for sampling excitation voltages corresponding to a plurality of batteries through a multiplexer at different periods to obtain electrochemical impedance spectroscopy of the plurality of batteries. In this way, a circuit structure can be simplified. As a result, cost of EIS detection is further reduced.

By combining some implementations of the first aspect, in a fifth possible implementation of the first aspect, where the analog-to-digital converter multiplexes an analog-to-digital converter in the battery monitoring chip.

Multiplexing the analog-to-digital converter in the battery monitoring chip can further reduce cost and volume of EIS detection.

By combining some implementations of the first aspect, in a sixth possible implementation of the first aspect, where the excitation voltage and an actual voltage of the battery during a using process are channel-switched to the analog-to-digital for being sampled by a multiplexer in the battery monitoring chip.

Similarly, a sharing analog-to-digital converter is employed for sampling the excitation voltage corresponding to the battery and the actual voltage of the battery during a using process through a multiplexer at different periods. In this way, a circuit structure can be simplified. As a result, cost of EIS detection is further reduced.

By combining some implementations of the first aspect, in a seventh possible implementation of the first aspect, where the MOS switch is integrated in the battery monitoring chip.

Integrating the MOS switch in the battery monitoring chip is advantageous for diagnosis of the MOS switch.

By combining some implementations of the first aspect, in an eighth possible implementation of the first aspect, where the MOS switch is disposed outside the battery monitoring chip.

Disposing the MOS switch outside the battery monitoring chip can design the MOS switch flexibly and is advantageous to adjust an excitation current generated by the battery.

By combining some implementations of the first aspect, in a ninth possible implementation of the first aspect, where the battery is a battery group formed by connecting a plurality of battery cells in series; the excitation resistor is configured to enable the battery group to generate an excitation current when the gate electrode of the MOS switch receives the pulse waveform; the detection resistor is configured to convert the excitation current into an excitation voltage, the excitation voltage is configured to calculate an electrochemical impedance of the battery group, and electrochemical impedances of the battery group under different frequencies are configured to form electrochemical impedance spectroscopy of the battery group.

In an actual application, it is not necessarily to perform EIS detection for each battery cell and employing a single EIS detection channel to measure an electrochemical impedance of a battery group consisting of a plurality of battery cells can reduce the number of pins of the battery monitoring chip.

By combining some implementations of the first aspect, in a tenth possible implementation of the first aspect, where the electrochemical impedance spectroscopy is obtained by calculation of a data processing unit in the battery monitoring chip.

By combining some implementations of the first aspect, in an eleventh possible implementation of the first aspect, where a filtering is provided by a data filtering unit in the battery monitoring chip for the excitation voltage passing through a analog-to-digital converter.

Providing a filtering for a digital signal after being converted by an analog-to-digital converter can improve stability of a sampling value.

By combining some implementations of the first aspect, in a twelfth possible implementation of the first aspect, the excitation resistor and the detection resistor are further configured for discharge equalization of the battery when the MOS switch is on.

By combining some implementations of the first aspect, in a thirteenth possible implementation of the first aspect, where electrochemical impedance spectroscopy of the battery is configured to obtain a state parameter of the battery, and the state parameter includes at least one of a state of charge (SOC), a charge health state (SOH) and a direct current resistance (DCR).

EIS detection for the state parameter of the battery has a high sensitivity and good real-time performance, when a slight substance change appears inside a battery, but the change is not represented by a voltage and a temperature of the battery, it can be recognized in advance for early warning, thereby achieving more accurate and timely warning for heat out of control.

A second aspect provides a battery management system, including the detection apparatus of electrochemical impedance spectroscopy in the first aspect and any one possible implementation of the first aspect and a battery monitoring chip, where a waveform generator in the detection apparatus is integrated in the battery monitoring chip, the detection resistor is configured to output the excitation voltage, the battery monitoring chip is configured to calculate an electrochemical impedance of the battery according to the excitation voltage, and electrochemical impedances of the battery under different frequencies are configured to form electrochemical impedance spectroscopy of the battery.

By combining the second aspect, in a first possible implementation of the second aspect, where the MOS switch is integrated in the battery monitoring chip.

By combining some implementations of the second aspect, in a second possible implementation of the second aspect, where the MOS switch is disposed outside the battery monitoring chip.

BRIEF DESCRIPTION OF DRAWINGS

To describe the technical solutions in the embodiments of the present application more clearly, the following briefly describes the accompanying drawings required for describing the embodiments of the present application. Apparently, the accompanying drawings in the following description show merely some embodiments of the present application, and a person of ordinary skill in the art may still derive other drawings from these accompanying drawings without creative efforts.

DESCRIPTION OF EMBODIMENTS

Figure 1:
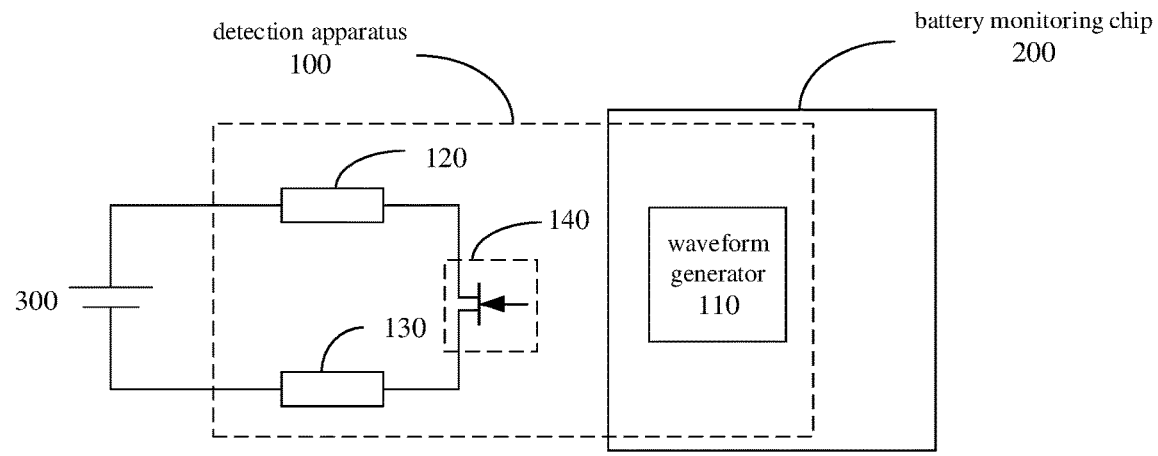
FIG. 1 is a schematic block diagram of a detection apparatus of electrochemical impedance spectroscopy disclosed by embodiments of the present application.

The following further describes the implementations of the present application in detail with reference to the accompanying drawings and embodiments. Detailed description of the following embodiments and accompanying drawings are used to illustratively state the principles of the present application, but not to limit the scope of the present application, that is, the present application is not limited to the embodiments described.

In the descriptions of the present application, it should be noted that unless otherwise described additionally, "plural" means more than two; and the orientations or positional relationships indicated by the terms "up", "down", "left", "right", "inside", "outside", and the like are merely intended to facilitate the descriptions of the present application and simplify the descriptions, but not intended to indicate or imply that the apparatuses or components mentioned must have specific orientations, or be constructed and operated for a specific orientation, and therefore shall not be understood as a limitation to the present application. In addition, the terms "first", "second" and "third" etc. are merely intended for a purpose of description, and shall not be understood as an indication or implication of relative importance. "Vertical" does not mean vertical in the strict sense, but to be vertical within a permitted range of an error. "Parallel" does not mean parallel in the strict sense, but to be parallel within a permitted range of an error.

The location words appearing in the following descriptions are all directions indicated in the drawings, but not to constitute any limitation to the specific structure of the present application. In the description of the present application, it should be further noted that unless otherwise prescribed and defined clearly, terms "mounting", "communicating" and "connection" should be understood in a broad sense, which for example can be a fixed connection and can also be a detachable connection or an integral connection; or can be a direct connection and can also be a connection through an intermediary. A person of ordinary skill in the art can understand specific meanings of these terms in the present application based on specific situations.

Electrochemical impedance spectroscopy means that a disturbing electrical signal is applied to an electrochemical system, then a response of the system is observed and electrochemical properties of the system are analyzed by the response signal. Differently, the disturbing electrical signal applied by EIS to the electrochemical system is an AC sinusoidal potential wave in a small amplitude at different frequencies instead of being a DC potential or current, and the measured response signal is a ratio of an AC potential to a current instead of being a change of a DC current or potential with the time, which is generally known as an impedance of the system, the impedance of the system varying with a sinusoidal wave frequency (0 or a phase angle of the impedance varying with a frequency.

For example, a disturbing signal X is input to an electrochemical system M, and the electrochemical system M may output a response signal Y. A function for describing a relationship of disturbance and response is known as a transfer function $G(\omega)$. That is: $G(\omega)=Y/X$. If X is a sinusoidal wave current signal with an angular frequency of $\omega$, Y may be a sinusoidal potential signal with an angular frequency of $\omega$ as well. At this time, the transfer function $G(\omega)$ is also a function of the frequency, known as a frequency response function, which is known as an impedance of the system M and represented by Z. EIS technique is to measure a ratio of a disturbing signal X to a response signal Y at different frequencies $\omega(\varphi)$, thereby obtaining a real part Z', a virtual part Z", norm |Z| and a phase angle $\varphi$ of an impedance under different frequencies, and then these quantities are plotted into curves of various forms to obtain an electrochemical impedance spectroscopy.

An electrochemical system is regarded as an equivalent circuit. The equivalent circuit is formed by connecting a resistor R, a capacitor C, an inductor L and other basic elements in series or in parallel or in other manners. Through EIS, composition of the equivalent circuit and a size of each element value can be detected. Using electrochemical meanings of these elements, a structure of the electrochemical system and property of a polarization process etc. are analyzed. For example, an internal resistance (including internal resistance of an electrolytic solution and an electrode) of a battery, an electric-double-layer capacitance and faraday impedance (including a charge transfer resistance and Warburg impedance) can be analyzed.

According to related studies and analysis, electrochemical impedance spectroscopy of a battery presented under different SOC, SOH and DCR is inconsistent. Therefore, state detection of the battery can be performed through EIS detection.

A current EIS detection for a battery is mainly performed by directly inputting an excitation of different frequencies for a battery with an external direct current-direct current (DC-DC) device and then collecting a corresponding response to thus calculate electrochemical impedance spectroscopy of the battery. Although the prior art is also capable of performing EIS detection on the battery, thus the EIS detection apparatus is of high cost, large volume and complicated solution due to need of importing an additional DC-DC device, such that it is generally used at a working station for studying and analysis of the battery, without being used for state detection of the battery in a using process.

In view of this, embodiments of the present application provide a new detection apparatus of electrochemical impedance spectroscopy, with which injection of an excitation current is realized by the waveform generator in the battery monitoring chip, thereby smartly integrating an EIS detection apparatus in a chip architecture. Thus, cost and volume of EIS detection can be reduced, which enables it to be widely applied in the BMS and makes it easier to be applied for state detection of the battery in a using process.

It should be understood that the battery in embodiments of the present application can be a lithium-ion battery, a lithium-metal battery, a lead-acid battery, a nickel-cadmium battery, a nickel-hydrogen battery, a lithium-sulfur battery, a lithium-air battery or a sodium-ion battery etc., which are not limited herein. Regarding scale, the battery in embodiments of the present application can be a battery cell and can also be a battery module or a battery pack including a plurality of battery cells or can also be known as a battery group, which are not limited therein. Regarding an application scene, the battery can be applied in an automobile, a ship and other power apparatuses. For example, it can be applied in a power automobile to power a motor of the power automobile as a power source of the electric automobile. The battery can also power other electric appliances in an electric automobile, such as an air conditioner inside, an on-board player and the like.

FIG. 1 shows a schematic block diagram of a detection apparatus 100 of electrochemical impedance spectroscopy disclosed by embodiments of the present application;

As shown in FIG. 1, the detection apparatus 100 includes a waveform generator 110, the waveform generator 110 being integrated in a battery monitoring chip 200. The detection apparatus 100 also includes an excitation resistor 120, a detection resistor 130, and an MOS switch 140, where one of one end of the excitation resistor 120 and one end of the detection resistor 130 is connected to a positive electrode of a battery 300, the other of one end of the excitation resistor 120 and one end of the detection resistor 130 is connected to a negative electrode of the battery 300, one of the other end of the excitation resistor 120 and the other end of the detection resistor 130 is connected to a source electrode of the MOS switch 140, and the other of the other end of the excitation resistor 120 and the other end of the detection resistor 130 is connected to a drain electrode of the MOS switch 140.

Where MOS switch 140 is an abbreviation of Metal-Oxide-Semiconductor Field-Effect Transistor (MOSFET). The waveform generator 110 is used for generating a pulse waveform, i.e. a pulse-width modulation (PWM) waveform, which can also be known as a square wave. A gate electrode of the MOS switch 140 is used for receiving the pulse waveform generated by the waveform generator 110. The excitation resistor 120 is used for enabling the battery 300 to generate an excitation current when the gate electrode of the MOS switch 140 receives the pulse waveform generated by the waveform generator 110. The detection resistor 130 is used for converting the excitation current generated by the battery 300 into an excitation voltage, and the excitation voltage is used for calculating an electrochemical impedance of the battery 300.

The waveform generator 110 can generate pulse waveforms under different frequencies and the pulse waveforms under different frequencies corresponds to different electrochemical impedances of the battery 300, and the different electrochemical impedances can form electrochemical impedance spectroscopy of the battery 300.

Specifically, the waveform generator 110 can generate a pulse waveform within a frequency range of 100 mHz~5 kHz to drive the MOS switch 140 to turn on. Then according to a change of the frequency, the battery 300 may have different responses. By collecting a voltage of the detection resistor 130, a current response can be known. Thus, the electrochemical impedance of the battery 300 can be calculated. After completing a cycle of a change of the frequency within the range of 100 mHz~5 kHz, electrochemical impedance spectroscopy, known as an impedance spectroscopy curve, can be depicted. Certainly, in an actual application, certain interference may exist. Therefore, multiple detections can be performed to optimize the impedance spectroscopy curve.

EIS detection involves a response of an electrochemical system to an external excitation under different frequencies. Generally, the excitation can be a constant voltage and can also be a constant current. Due to lower impedance of a lithium-ion battery, thus a constant-current excitation is better in embodiments of the present application. A manner for a constant-current excitation is to apply a current excitation of a known frequency to a battery through an excitation resistor, enabling the battery to generate an excitation current and then measure a voltage generated on the detection resistor.

A battery monitoring chip can also be known as a battery control chip, a battery sampling chip, a voltage collection chip, a cell monitoring chip, a cell control chip, or a cell sampling chip etc. A battery monitoring chip is generally used to collect an actual voltage of a battery in a using process for a BMS to make various judgments.

Optionally, the detection apparatus 100 of EIS in embodiments of the present application can be applied to the battery management system (BMS) and the battery management system can include a battery monitoring chip 200.

Therefore, in embodiments of the present application, an excitation is applied to the battery by integrating the waveform generator in the EIS detection apparatus in the battery monitoring chip and employing the resistor and the MOS switch and other simple electronic elements, without requiring an additional device for injection of the excitation to the battery, thus simplifying the EIS detection solution and reducing EIS detection cost, and enabling EIS detection to be widely applied in the BMS.

Optionally, in embodiments of the present application, electrochemical impedance spectroscopy of the battery 300 is used for obtaining a state parameter of the battery 300, and the state parameter includes at least one of a SOC, a SOH, and a DCR. Optionally, an internal resistance, an internal temperature and other parameters of the battery 300 can also be evaluated through electrochemical impedance spectroscopy of the battery 300.

In one embodiment, the obtained electrochemical impedance spectroscopy can be compared with the impedance spectroscopy curve obtained at the testing stage, and a battery model can be established. The battery model can be an equivalent circuit described above. According to the battery model, the related parameters of the battery 300 can be inferred.

In another embodiment, the related parameters of the battery 300 can be obtained directly through the algorithm based on the obtained electrochemical impedance spectroscopy. It should be understood that embodiments of the present application do not make any limitation to how to obtain related parameters of the battery based on electrochemical impedance spectroscopy.

EIS detection for the state parameter of the battery has a high sensitivity and good real-time performance, when a slight substance change appears inside a battery, but the change is not represented by a voltage and a temperature of the battery, it can be recognized in advance for early warning, thereby achieving more accurate and timely warning for heat out of control.

It should be noted that although the waveform generator in the detection apparatus of electrochemical impedance spectroscopy provided in embodiments of the present application is integrated in the battery monitoring chip, optionally, the waveform generator can also be realized through other manners. For example, running code in the processor of the BMS can realize to generate the pulse waveform. As along as the waveform generator is implemented with the existing chip in the BMS, without using an additional device, it will be in the protection scope of the technical solution of the present application.

Optionally, in embodiments of the present application, the detection apparatus 100 can further include an analog-to-digital converter for sampling an excitation voltage corresponding to the battery 300.

The Analog to Digital Converter (ADC) is a circuit that converts an analog signal into a digital signal. More specifically, the ADC can convert time-continued and amplitude-continued analog signal into a time-discrete and amplitude-discrete digital signal. In embodiments of the present application, voltage at two ends of the detection resistor 130 can be sampled to sample an excitation voltage corresponding to the battery 300.

It should be noted that the ADC can employ a single-end input, also known as a single-end sampling, that is, the ADC only has one input end, in which case public ground is used as a returning end of the circuit. Such an inputting manner is simple and easy to implement. The ADC can also adopt a differential input, also known as a differential sampling, that is, the ADC has two input ends. Since the two input ends are generally distributed together, their interference is almost the same. Inputs with a common-mode interference will be reduced when inputting to the ADC, thus reducing interference.

To facilitate descriptions below, a new term, i.e. an EIS detection channel, will be introduced. One EIS detection channel can include an excitation resistor, a detection resistor and a MOS switch, where reference can be made to the descriptions of FIG. 1 regarding manners of connecting the excitation resistor, the detection resistor and the MOS switch.

Optionally, in one embodiment of the present application, one battery can be regarded as a battery cell. One battery cell corresponds to one EIS detection channel. If it is necessary to perform EIS detection on each battery cell in a plurality of battery cells, the plurality of battery cells need to be in one-to-one correspondence to a plurality of EIS detection channels.

Optionally, in another embodiment of the present application, one battery can be regarded as a plurality of battery cells. For example, it can be a battery group formed by connecting a plurality of battery cells in series. In an actual application, it is not necessary to perform EIS detection on each battery cell. Therefore, one EIS detection channel can be applied to perform EIS detection on the battery group. That is, the excitation resistor in the one EIS detection channel is used for enabling the battery group to generate an excitation current when the gate electrode of the MOS switch in the one EIS detection channel receives the pulse waveform, and the detection resistor in the one EIS detection channel is used for converting the excitation current generated by the battery group into an excitation voltage, where the excitation voltage obtained is used for calculating an electrochemical impedance of the battery group, and electrochemical impedances of the battery group under different frequencies are used for forming electrochemical impedance spectroscopy of the battery group.

When it is necessary to perform EIS detection on each battery cell in a plurality of battery cells, the plurality of battery cells respectively pass through a plurality of EIS detection channels and obtain a plurality of excitation voltages sampled by the ADC.

Optionally, the detection apparatus 100 includes one ADC, and the one ADC is used for sampling a plurality of excitation voltages corresponding to a plurality of batteries. Further, the detection apparatus 100 can further include a multiplexer, and the one ADC samples the plurality of excitation voltages which are channel-switched by the multiplexer.

Optionally, the detection apparatus 100 can further include a plurality of ADCs, that is, one ADC corresponds to one EIS detection channel. Then, each ADC in the plurality of ADCs is used for sampling an excitation voltage corresponding to a battery in the plurality of batteries.

It should be understood that a plurality of battery cells can be divided into two portions, and each battery cell in one portion of the battery cells needs EIS detection, that is, each battery cell in the portion of the battery cells corresponds to one EIS detection channel. EIS detection is performed for the other portion of the battery cells as a battery group, that is, the battery group corresponds to one EIS detection channel.

Optionally, in embodiments of the present application, the ADC in the detection apparatus 100 can multiplex the ADC in the battery monitoring chip. The ADC in the battery monitoring chip is generally used to collect an actual voltage of a battery in a using process. That is, the ADC for collecting the excitation voltage of the battery can multiplex the ADC for collecting an actual voltage of a battery in a using process. Similarly, the ADC in the battery monitoring chip can sample an excitation voltage and an actual voltage of a battery in a using process which are channel-switched by the multiplexer.

Optionally, in embodiments of the present application, the ADC in the detection apparatus 100 may not multiplex the ADC in the battery monitoring chip, but to be integrated in the battery monitoring chip. That is, the ADC for collecting the excitation voltage and the ADC for collecting an actual voltage of a battery in a using process are both integrated in the battery monitoring chip and independent of each other.

To sum up, if a plurality of excitation voltages and a plurality of actual voltages exist, it can be implemented through the following several manners:

Firstly, the battery monitoring chip can only include one ADC, and the one ADC not only collects the plurality of excitation voltages, but also collects the plurality of actual voltages. Moreover, the one ADC collects the plurality of excitation voltages and the plurality of actual voltages which are channel-switched by the multiplexer in the battery monitoring chip.

Secondly, the battery monitoring chip includes a plurality of ADCs, where the plurality of ADCs are divided into two portions, each ADC in one portion of the ADCs is used for collecting corresponding excitation voltage of the plurality of excitation voltages, and each ADC in the other portion of the ADCs is used for collecting corresponding actual voltage of the plurality of actual voltages. That is, the plurality of ADCs are in one-to-one correspondence to each voltage of the plurality of excitation voltages and the plurality of actual voltages. In this implementation, the multiplexer may not be required.

Thirdly, the battery monitoring chip only includes two ADCs, one for collecting the plurality of excitation voltages and the other for collecting the plurality of actual voltages. Similarly, the battery monitoring chip can include two multiplexers: one for channel-switching a plurality of excitation voltages to corresponding ADC for being sampled and the other for channel-switching a plurality of actual voltages to corresponding ADC for being sampled.

Fourthly, the battery monitoring chip includes a plurality of ADCs, where each ADC of the plurality of the ADCs collects one excitation voltage of the plurality of excitation voltages and one actual voltage of the plurality of actual voltages. Similarly, the battery monitoring chip can include a plurality of multiplexers, and each ADC of the plurality of the ADCs collects a corresponding excitation voltage or a corresponding actual voltage through a corresponding multiplexer.

Fifthly, the battery monitoring chip includes a plurality of ADCs and the plurality of ADCs can be divided into at least three combinations of the following five types: an ADC for only collecting one excitation voltage, an ADC for only collecting one actual voltage, an ADC for collecting a plurality of excitation voltages, an ADC for collecting a plurality of actual voltages, and an ADC for collecting both excitation voltages and actual voltages.

It should be understood that ADCs for collecting excitation voltages may not be integrated in the battery monitoring chip, but to employ separate ADC chips.

In one embodiment, the MOS switch 140 in the detection apparatus 100 can be integrated in the battery monitoring chip and the solution is advantageous for diagnosis of the MOS switch.

In another embodiment, the MOS switch 140 in the detection apparatus 100 can also be disposed outside the battery monitoring chip, and in the solution, the MOS switch is flexible and is advantageous to adjust an excitation current generated by the battery.

Optionally, in embodiments of the present application, the excitation voltage sampled by the ADC can be converted into electrochemical impedance spectroscopy through a data processing unit in the battery monitoring chip.

Optionally, in embodiments of the present application, the excitation voltage sampled by the ADC can also be provided with a filtering by a data filtering unit in the battery monitoring chip, thus increasing stability of sampling values and improving detection reliability of the detection apparatus 100.

Optionally, in embodiments of the present application, the excitation resistor 120 and the detection resistor 130 can also perform discharge equalization for the battery 300 when the MOS switch 140 is on. At this time, what is received by the gate electrode of the MOS switch 140 is a constant level. The magnitude of the constant level can depend on the type of the MOS switch 140.

It should be noted that each module may not multiplex each functional model in the battery monitoring chip. For example, the data processing unit can be realized with the processor in the BMS.

The following describes the detection apparatus of electrochemical impedance spectroscopy in embodiments of the present application in details by incorporating FIG. 2 to FIG. 8. The detection apparatus is added with an EIS detection function on the basis of the existing battery monitoring chip. Regarding other functions of the battery monitoring chip, the battery monitoring chip in the current market can be referred to specifically.

To facilitate descriptions, each module involved in embodiments of the present application will be introduced below one by one.

The waveform generator 410 is used for generating a pulse waveform and then driving a MOS switch 440 to enable the MOS switch to turn on according to a specified frequency. The waveform generator 410 can be integrated in a battery monitoring chip 500.

The excitation resistor 420 is used for enabling the battery 600 to generate an excitation current when the MOS switch 440 is on. According to the actually needed excitation current, a resistance value of the corresponding excitation resistor can be selected.

The detection resistor 430 is used for detecting an excitation current. Specifically, the excitation current can be converted into an excitation voltage through the detection resistor 430 and then sampled through the ADC 505. It should be noted that two ends of the detection resistor 430 can be provided with two sampling lines S_P and S_N to realize differential sampling, thus improving anti-interference ability. However, S_N is not a required line.

Figure 2:
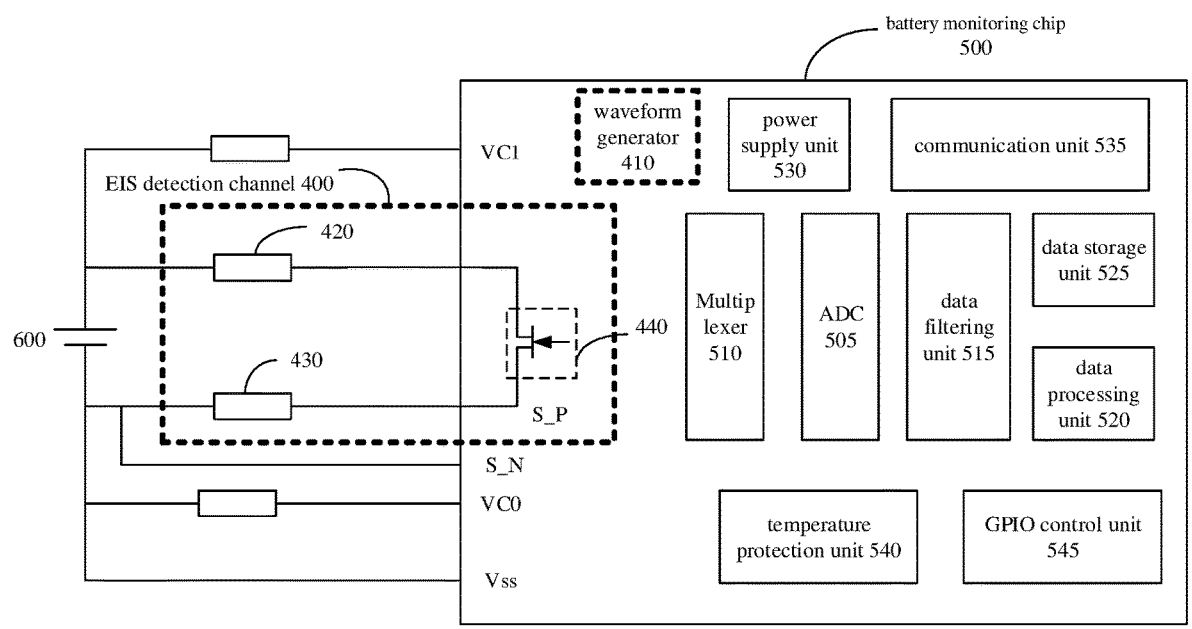
FIG. 2 is a schematic block diagram of a detection apparatus of a single-cell-single-EIS detection channel disclosed by embodiments of the present application.

The MOS switch 440 is used for controlling generation of an excitation current. When it is on, the excitation current is generated; and when it is off, generation of the excitation current is stopped. Specifically, a gate electrode of the MOS switch 440 can be used for receiving the pulse waveform generated by the waveform generator 410 and the MOS switch 440 is on and off under the control of the pulse waveform. The MOS switch 440 can be integrated in the battery monitoring chip 500, as shown in FIG. 2. The MOS switch 440 can be disposed outside the battery monitoring chip 500, as shown in FIG. 3 to FIG. 8.

The ADC 505 is used for collecting an input voltage of a cell voltage input channel, that is, the actual voltage of the battery 600 in a using process. The ADC 505 is also used for collecting the voltage at two ends of the detection resistor 430, that is, the excitation voltage. Specifically, the ADC 505 converts the input analog voltage signal into a digital signal.

The multiplexer 510 is used for channel-switching the input voltages (including the excitation voltage and/or the actual voltage) to the ADC 505 for being sampled.

The data filtering unit 515 is used for providing a filtering for a digital signal after being converted by the ADC 505, thereby improving sampling stability, thus enhancing detection reliability.

The data processing unit 520 is used for processing the excitation voltage and the actual voltage after being converted by the ADC 505 and converting the collected excitation voltage into electrochemical impedance spectroscopy. The data processing unit 520 can perform an instruction transferred from a communication unit 535 for controlling work of the battery monitoring chip 500.

A data storage unit 525 is used for storing the collected voltage data.

A power supply unit 530 is used for converting a changing cell voltage into a stable voltage, for powering other modules inside, for example, providing a reference power source for the ADC 505 or providing a power supply source for the communication unit 535.

The communication unit 535 is a transmitting interface and a receiving interface of the battery monitoring chip 500 for receiving an instruction transmitted from the exterior or transmitting internal data of the battery monitoring chip 500 to the exterior.

A temperature protection unit 540 is used for detecting a temperature of the battery monitoring chip 500. When the temperature is higher a certain threshold, the MOS switch 440 is disabled to turn on, for reducing power consumption of the chip and preventing over-temperature ablation of chip or causing instability for work of other modules.

A General-purpose input/output (GPIO) control unit 545 is used for controlling a GPIO interface of the battery monitoring chip to extend functions of the chip. The GPIO can be multiplexed as a Serial Peripheral Interface (SPI), an Inter-Integrated Circuit (IIC) bus or an analog signal sampling interface.

In addition, Vss can be understood as a power source ground of the battery monitoring chip.

It can be seen from FIG. 1 to FIG. 8 that one end of the excitation resistor is connected to a positive electrode of the battery and one end of the detection resistor is connected to a negative electrode of the battery. It should be noted that such a connection relationship involves only descriptions with examples. Obviously, they can change positions with each other. That is, one end of the excitation resistor is connected to a negative electrode of the battery and one end of the detection resistor is connected to a positive electrode of the battery. Similarly, the connection relationship of the excitation resistor and the detection resistor with the MOS switch can also be exchanged as well. Embodiments of the present application do not constitute any restriction thereto.

FIG. 2 shows a schematic block diagram of a detection apparatus of a single-cell-single-EIS detection channel. As shown in FIG. 2, the detection apparatus includes one EIS detection channel 400 and a waveform generator 410. The EIS detection channel 400 includes an excitation resistor 420, a detection resistor 430 and a MOS switch 440 for EIS detection on a battery 600. Two ends of the detection resistor 430 are provided with two sampling lines S_P and S_N. Where the battery 600 can be one battery cell and the MOS switch 440 is integrated in the battery monitoring chip 500.

Specifically, a gate electrode of the MOS switch 440 can be used for receiving the pulse waveform generated by the waveform generator 410; the excitation resistor 420 enables the battery cell 600 to generate an excitation current when the gate electrode of the MOS switch 440 receives the pulse waveform; the detection resistor 430 converts the excitation current into an excitation voltage; and the ADC 505 collects the excitation voltage and the data processing unit 520 processes the collected excitation voltage to obtain an electrochemical impedance of the battery 600. A plurality of electrochemical impedances of the battery 600 obtained under a plurality of frequencies can form electrochemical impedance spectroscopy of the battery 600.

As shown in FIG. 2, the ADC 505 is further used for collecting an actual voltage. Two ends of the battery 600 are also provided with two sampling lines VC0 and VC1. The excitation voltage and the actual voltage are channel-switched through the multiplexer 510 to the ADC 505 for being sampled.

Figure 3:
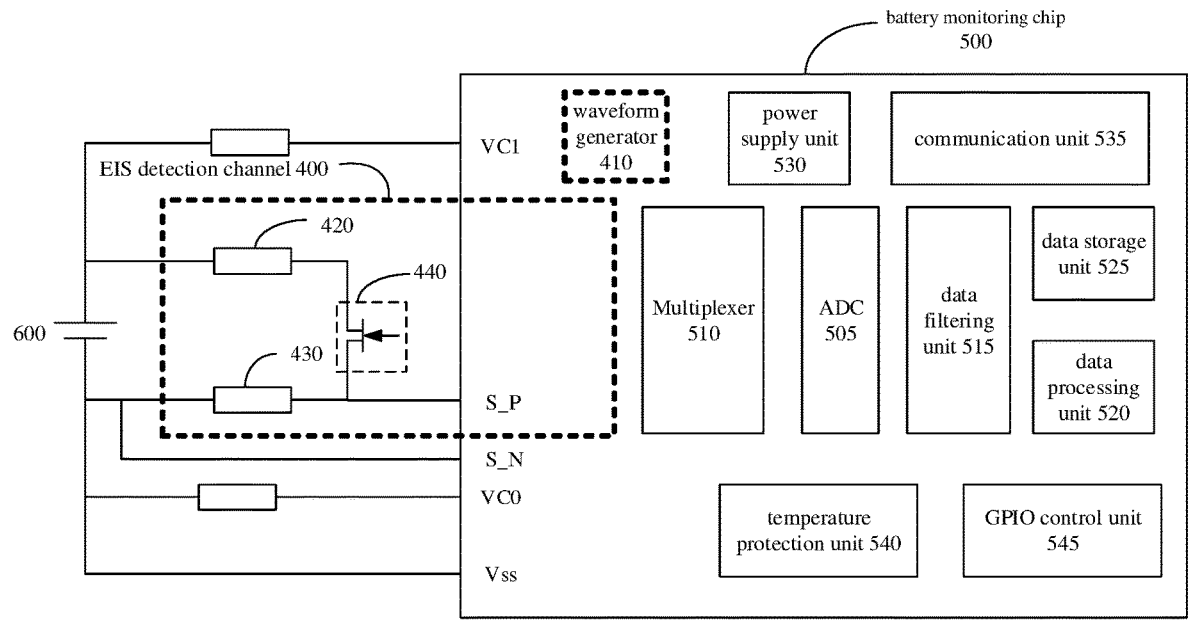
FIG. 3 is another schematic block diagram of a detection apparatus of a single-cell-single-EIS detection channel disclosed by embodiments of the present application.

FIG. 3 shows another schematic block diagram of a detection apparatus of a single-cell-single-EIS detection channel. Compared with FIG. 2, the MOS switch 440 can be disposed outside the battery monitoring chip 500. For functions of other modules, reference can be made to descriptions of FIG. 2.

Figure 4:
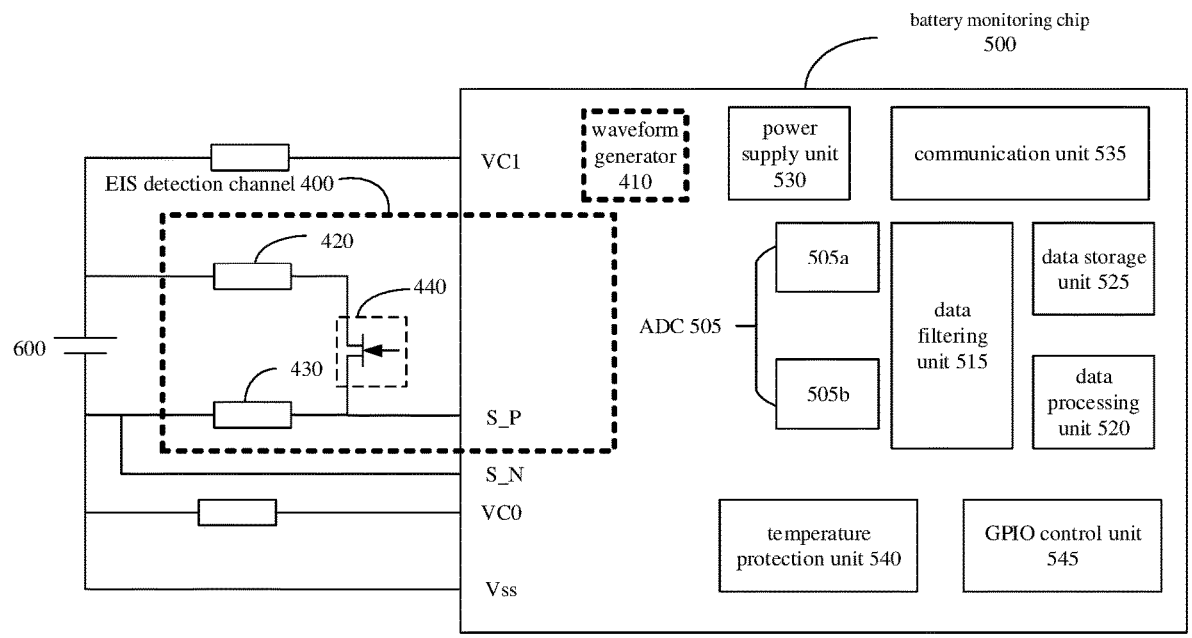
FIG. 4 is another further schematic block diagram of a detection apparatus of a single-cell-single-EIS detection channel disclosed by embodiments of the present application.

FIG. 4 shows another further schematic block diagram of a detection apparatus of a single-cell-single-EIS detection channel. Compared with FIG. 3, the ADC for collecting the excitation voltage and the ADC for collecting the actual voltage are separately disposed, that is, an ADC 505 includes an ADC 505a and an ADC 505b. Since the excitation voltage and the actual voltage are both sampled by the corresponding ADC, thus it is not necessary to dispose a multiplexer. For functions of other modules, reference can be made to descriptions of FIG. 2.

Figure 5:
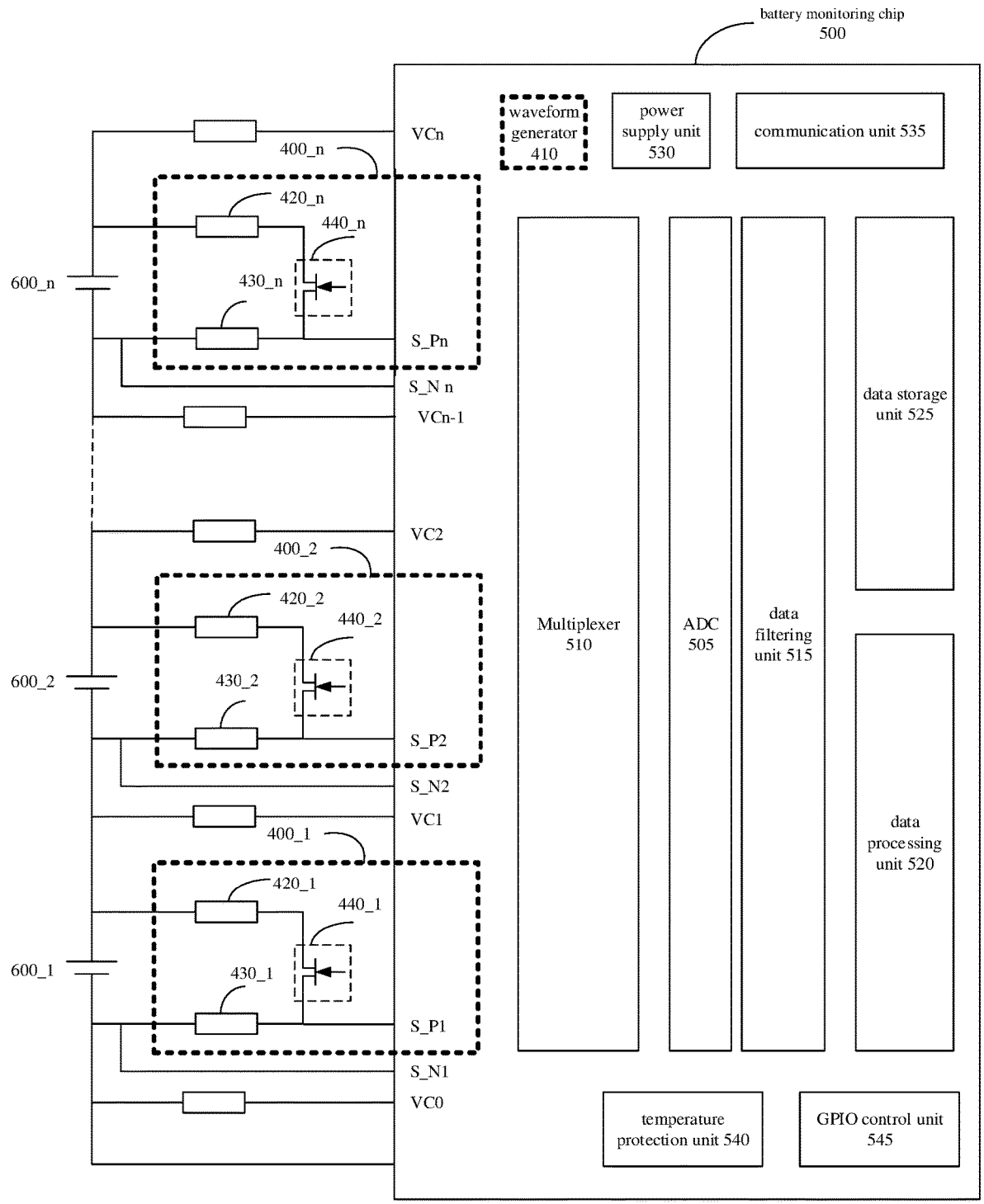
FIG. 5 is a schematic block diagram of a detection apparatus of a multi-cell-multi-EIS detection channel disclosed by embodiments of the present application.

FIG. 5 shows one schematic block diagram of a detection apparatus of a multi-cell-multi-EIS detection channel. Compared with FIG. 3, the detection apparatus includes a plurality of EIS detection channels (400_1, 400_2, ..., 400_n) and a waveform generator 410 for performing EIS direction on a plurality of battery cells (600_1, 600_2, ..., 600_n). Each of the EIS detection channels includes an excitation resistor, a detection resistor and a MOS switch. For example, an EIS detection channel 400_1 includes an excitation resistor 420_1, a detection resistor 430_1 and a MOS switch 440_1; an EIS detection channel 400_2 includes an excitation resistor 420_2, a detection resistor 430_2 and a MOS switch 440_2, ..., an EIS detection channel 400_n includes an excitation resistor 420_n, a detection resistor 430_n and a MOS switch 440_n. Two ends of the detection resistor (430_1, 430_2, ..., 430_n) in each of the EIS detection channels (400_1, 400_2, ..., 400_n) are both provided with sampling lines (S_P1, S_P2, ..., S_Pn) and sampling lines (S_N1, S_N2, ..., S_Nn). Similarly, two ends of each of the battery cells (600_1, 600_2, ..., 600_n) are both provided with sampling lines (VC0, VC1, ..., VCn−1, VCn). The ADC 505 not only samples excitation voltages of the plurality of battery cells (600_1, 600_2, ..., 600_n), but also samples actual voltages of the plurality of battery cells (600_1, 600_2, ..., 600_n). The plurality of excitation voltages and the plurality of actual voltages are channel-switched through a multiplexer 510 to the ADC 505 for being sampled. For functions of other modules, reference can be made to descriptions of FIG. 2.

Figure 6:
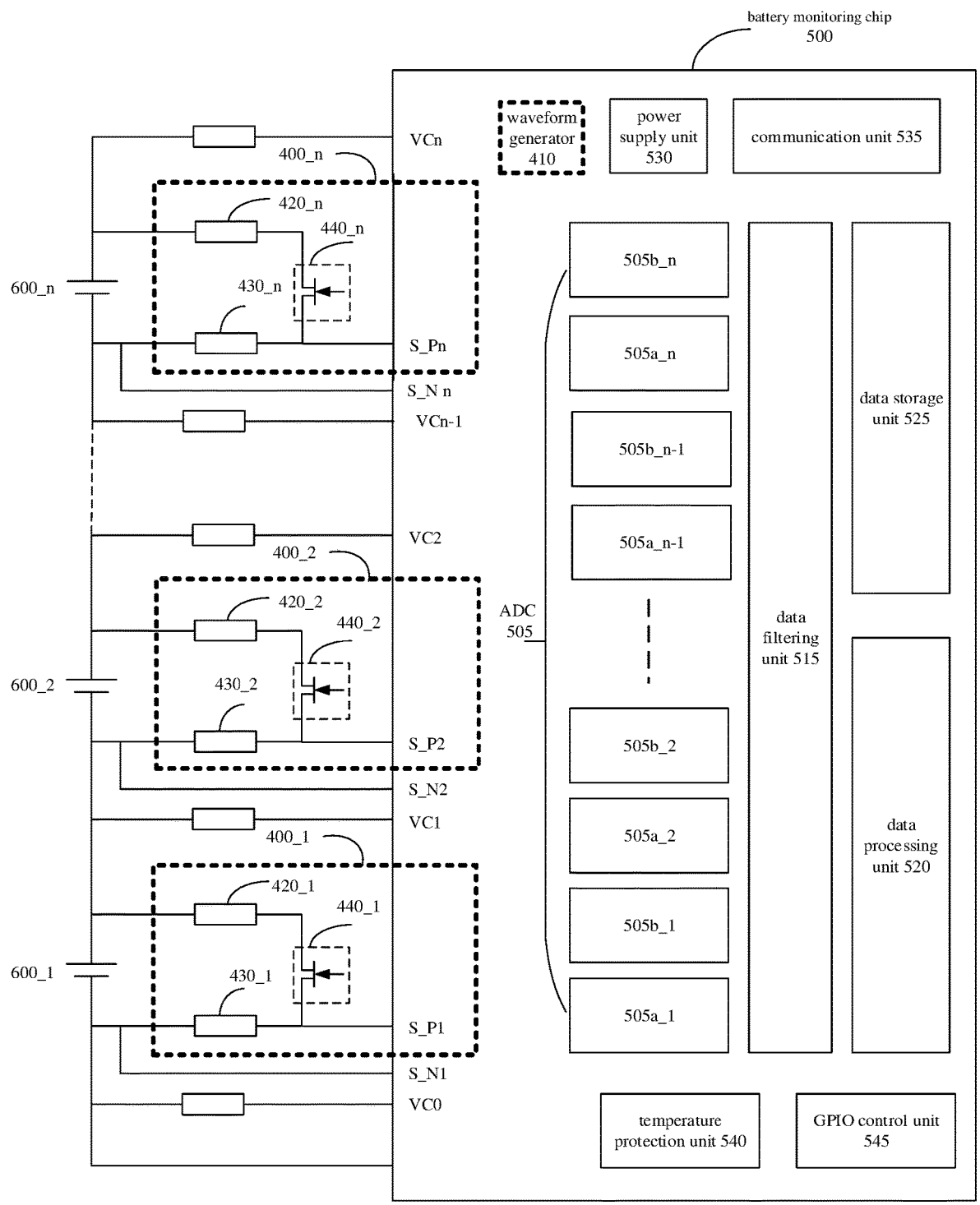
FIG. 6 is another schematic block diagram of a detection apparatus of a multi-cell-multi-EIS detection channel disclosed by embodiments of the present application.

FIG. 6 shows another schematic block diagram of a detection apparatus of a multi-cell-multi-EIS detection channel. Compared with FIG. 5, the ADC 505 includes a plurality of ADCs, the plurality of ADCs are divided into two types: ADC 505a and ADC 505b. ADCs of one type are used for collecting the excitation voltages and ADCs of the other type are used for collecting the actual voltages. Moreover, the number of ADCs included by ADCs of each type is the same as the number of corresponding voltages to be collected. For example, ADC 505a_1, ADC 505a_2, ..., ADC 505a_n−1, ADC 505a_n are used for collecting n excitation voltages and ADC 505b_1, ADC 505b_2, ..., ADC 505b_n−1, ADC 505b_n are used for collecting n actual voltages. Since the number of voltages to be collected is the same as the number of ADCs, thus it is not necessary to dispose the multiplexer. For functions of other modules, reference can be made to descriptions of FIG. 2.

Figure 7:
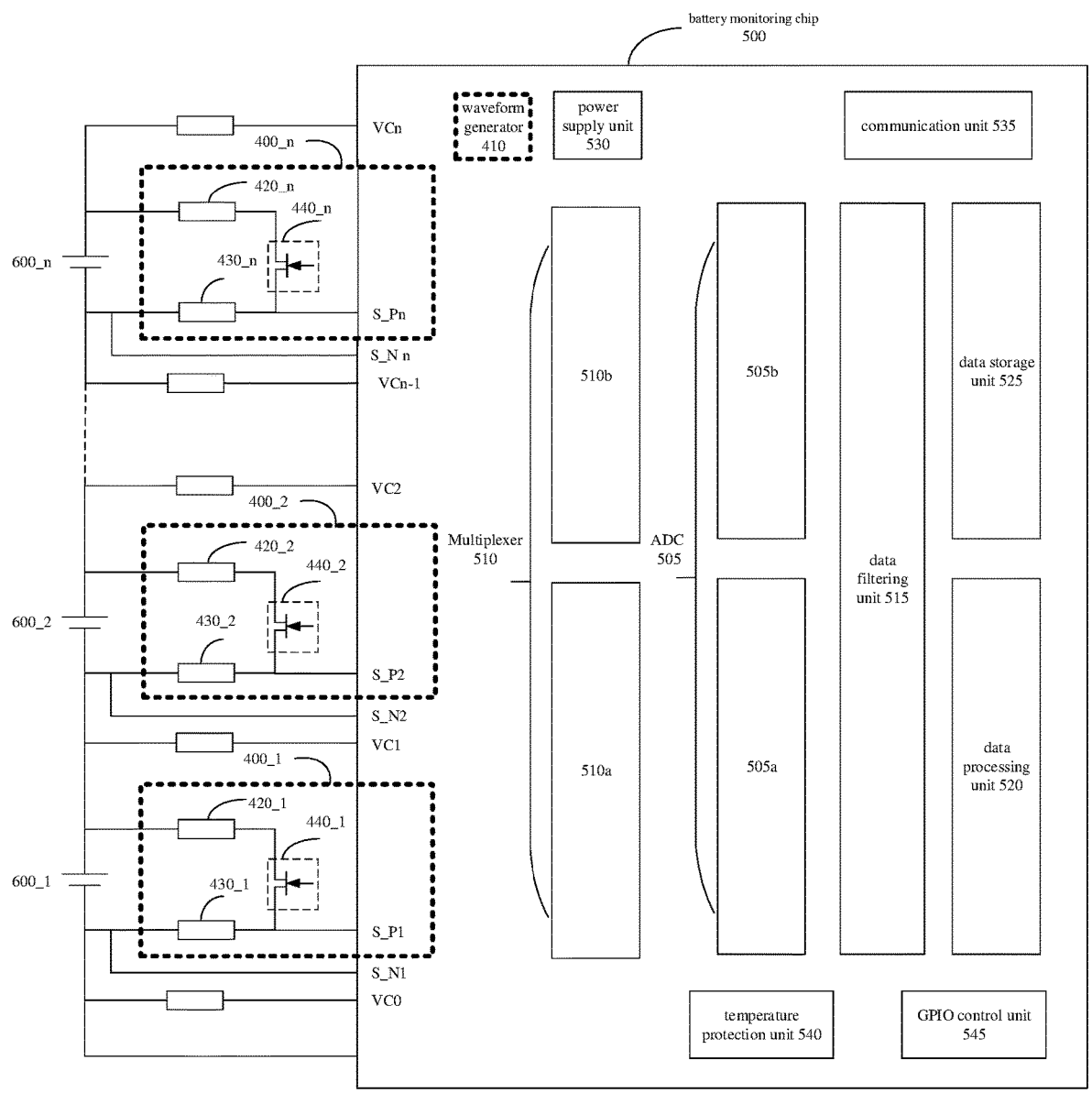
FIG. 7 is another further schematic block diagram of a detection apparatus of a multi-cell-multi-EIS detection channel disclosed by embodiments of the present application.

FIG. 7 shows another further schematic block diagram of a detection apparatus of a multi-cell-multi-EIS detection channel. Compared with FIG. 5, the ADC 505 includes two ADCs: ADC 505a and ADC 505b. One ADC is used for collecting a plurality of excitation voltages and the other ADC is used for collecting a plurality of actual voltages. Similarly, the multiplexer 510 includes two multiplexers: a multiplexer 510a and a multiplexer 510b. One multiplexer is used for channel-switching a plurality of excitation voltages to corresponding ADC for being sampled and the other multiplexer is used for channel-switching a plurality of actual voltages to corresponding ADC for being sampled. For functions of other modules, reference can be made to descriptions of FIG. 2.

Figure 8:
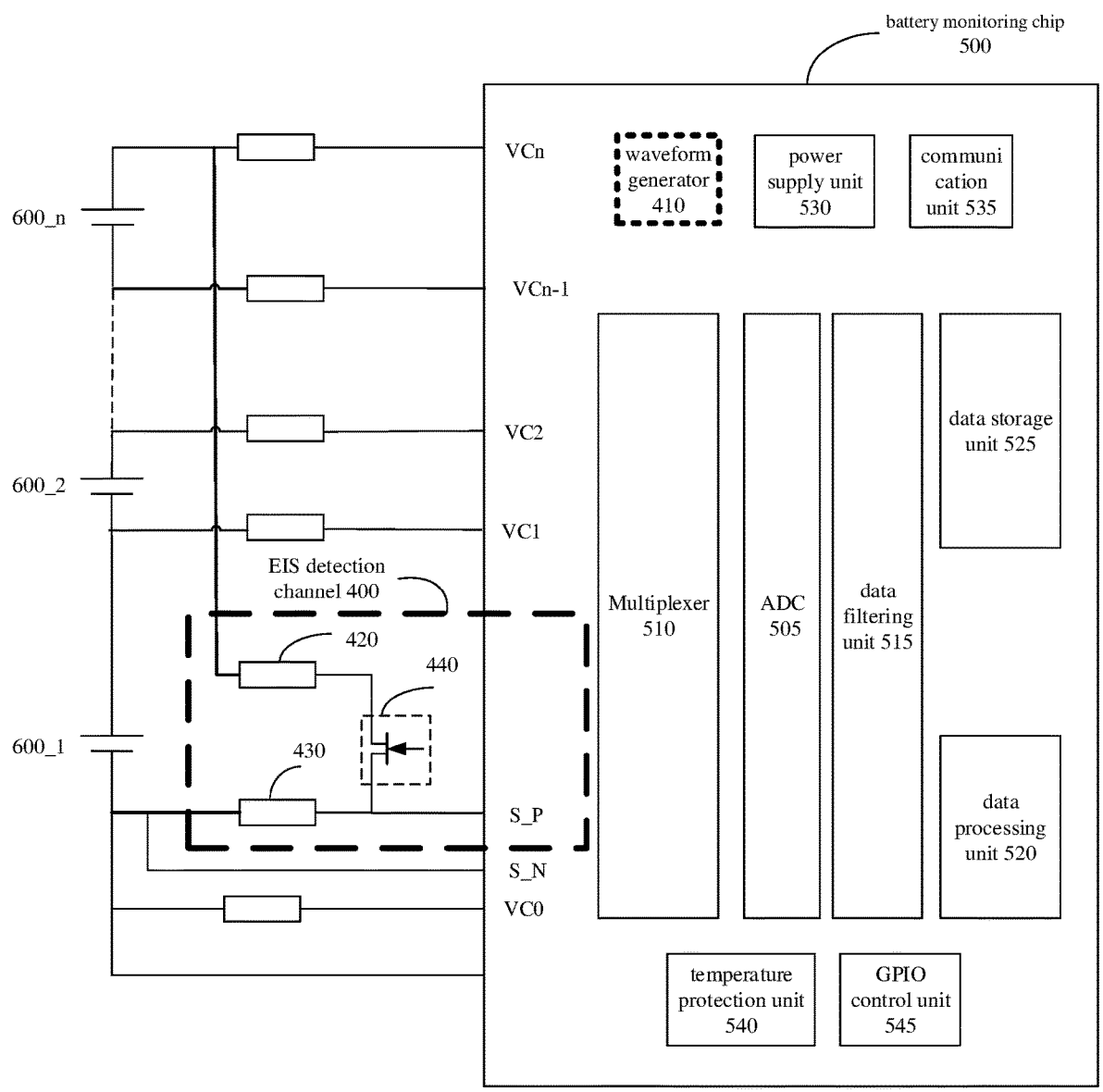
FIG. 8 is a schematic block diagram of a detection apparatus of a multi-cell-single-EIS detection channel disclosed by embodiments of the present application.

FIG. 8 shows a schematic block diagram of a detection apparatus of a multi-cell-single-EIS detection channel. Compared with FIG. 5, the one EIS detection channel 400 is used for EIS detection on a battery group consisting of a plurality of battery cells (600_1, 600_2, ..., 600_n), thereby obtaining an excitation voltage corresponding to the battery group. The ADC 505 is not only used for collecting the actual voltage of each battery cell of a plurality of battery cells (600_1, 600_2, ..., 600_n), but also used for collecting the excitation voltage corresponding to the battery group. The multiplexer 510 is used for channel-switching the actual voltages of the plurality of the battery cells and the excitation voltage of the battery group to the ADC 505 for being sampled. It should be noted that in the embodiment shown in FIG. 8, (n+1) ADCs can also be disposed, where n ADCs are respectively used for collecting n actual voltages and one ADC is used for collecting one excitation voltage corresponding to the battery group. For functions of other modules, reference can be made to descriptions of FIG. 2.

It should be noted that in each embodiment from FIG. 3 to FIG. 8, the MOS switch 440 can be integrated in the battery monitoring chip 500 as shown in FIG. 2.

Figure 9:
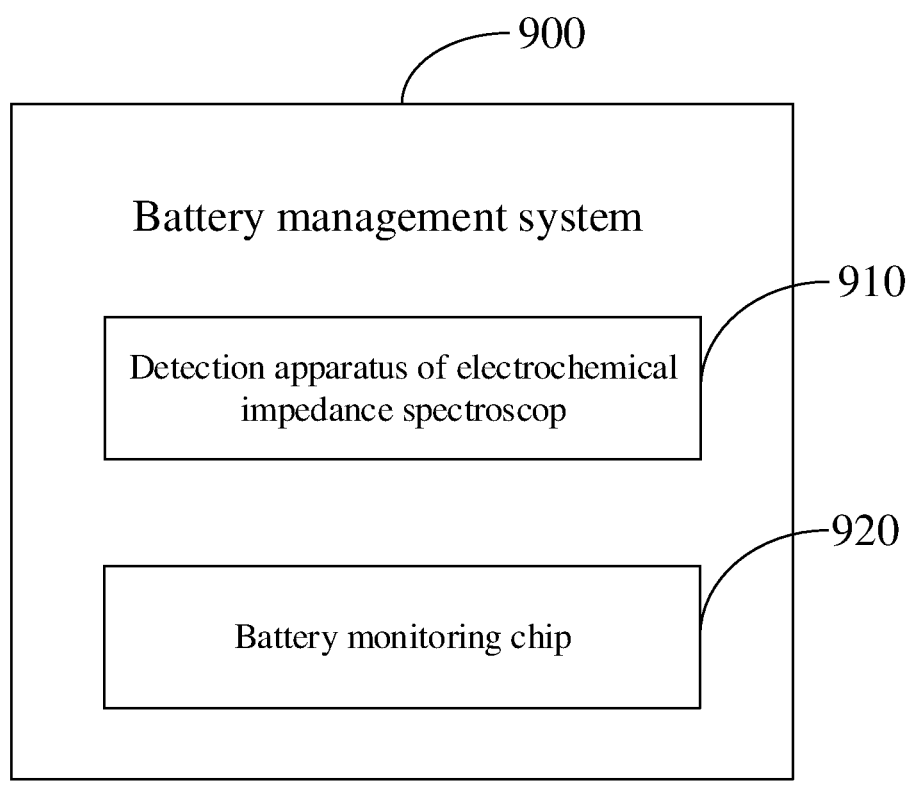
FIG. 9 is a schematic block diagram of a battery management system disclosed by embodiments of the present application.

As shown in FIG. 9, embodiments of the present application further provide a battery management system 900. the battery management system 900 includes a detection apparatus 910 of electrochemical impedance spectroscopy and a battery monitoring chip 920, where the detection apparatus 910 can be the detection apparatus of electrochemical impedance spectroscopy described in the above various embodiments, where a waveform generator in the detection apparatus 910 is integrated in the battery monitoring chip 920, the detection apparatus 910 is used for outputting the excitation voltage, the battery monitoring chip 920 is used for calculating an electrochemical impedance of the battery according to the excitation voltage output by the detection apparatus 910, and electrochemical impedances of the battery obtained under different frequencies are used for forming electrochemical impedance spectroscopy of the battery.

Although the present application has been described with reference to preferred embodiments, various improvements can be made thereto and equivalents can be used for replacement of members therein without departing from the scope of the present application. In particular, as long as a structural conflict does not exist, each technical feature mentioned in each embodiment can be combined in any manner. The present application is not restricted to particular embodiments disclosed herein, but to include all technical solutions falling in the scope of the claims.

What is claimed is:

1. A detection apparatus of electrochemical impedance spectroscopy, comprising:
   a waveform generator, the waveform generator being integrated in a battery monitoring chip;
   an excitation resistor; a detection resistor; and an MOS switch, wherein one of one end of the excitation resistor and one end of the detection resistor is connected to a positive electrode of a battery, the other of one end of the excitation resistor and one end of the detection resistor is connected to a negative electrode of the battery, one of the other end of the excitation resistor and the other end of the detection resistor is connected to a source electrode of the MOS switch, and the other of the other end of the excitation resistor and the other end of the detection resistor is connected to a drain electrode of the MOS switch;
   wherein the waveform generator is configured to generate a pulse waveform, a gate electrode of the MOS switch is configured to receive the pulse waveform, the excitation resistor is configured to enable the battery to generate an excitation current when the gate electrode of the MOS switch receives the pulse waveform, the detection resistor is configured to convert the excitation current into an excitation voltage, the excitation voltage is configured to determine an electrochemical impedance of the battery, pulse waveforms under different frequencies corresponds to different electrochemical impedances of the battery, and the different electrochemical impedances are configured to form electrochemical impedance spectroscopy of the battery.

2. The detection apparatus according to claim 1, wherein the detection apparatus further comprises:
   an analog-to-digital converter being configured to sample the excitation voltage corresponding to the battery.

3. The detection apparatus according to claim 2, wherein each analog-to-digital converter of a plurality of the analog-to-digital converters is configured to sample the excitation voltage corresponding to a corresponding battery in a plurality of the batteries, wherein the plurality of the analog-to-digital converters are in one-to-one correspondence to the plurality of the batteries.

4. The detection apparatus according to claim 2, wherein the analog-to-digital converter is configured to sample a plurality of the excitation voltages in one-to-one correspondence to a plurality of the batteries.

5. The detection apparatus according to claim 4, wherein the plurality of excitation voltages are channel-switched to the analog-to-digital converter for being sampled by a multiplexer.

6. The detection apparatus according to claim 2, wherein the analog-to-digital converter multiplexes an analog-to-digital converter in the battery monitoring chip.

7. The detection apparatus according to claim 6, wherein the excitation voltage and an actual voltage of the battery during a using process are channel-switched to the analog-to-digital for being sampled by a multiplexer in the battery monitoring chip.

8. The detection apparatus according to claim 1, wherein the MOS switch is integrated in the battery monitoring chip.

9. The detection apparatus according to claim 1, wherein the MOS switch is disposed outside the battery monitoring chip.

10. The detection apparatus according to claim 1, wherein the battery is a battery group formed by a plurality of battery cells in series connection;
    the excitation resistor is configured to enable the battery group to generate an excitation current when the gate electrode of the MOS switch receives the pulse waveform; and
    the excitation resistor is configured to convert the excitation current into an excitation voltage, the excitation voltage is configured to determine an electrochemical impedance of the battery group, pulse waveforms under different frequencies corresponds to different electrochemical impedances of the battery group, and the different electrochemical impedances are configured to form electrochemical impedance spectroscopy of the battery group.

11. The detection apparatus according to claim 1, wherein the electrochemical impedance spectroscopy is obtained by calculation of a data processing unit in the battery monitoring chip.

12. The detection apparatus according to claim 1, wherein a filtering is provided by a data filtering unit in the battery monitoring chip for the excitation voltage passing through an analog-to-digital converter.

13. The detection apparatus according to claim 1, wherein the excitation resistor and the detection resistor are further configured for discharge equalization of the battery when the MOS switch is on.

14. The detection apparatus according to claim 1, wherein the electrochemical impedance spectroscopy of the battery is configured to obtain a state parameter of the battery, and the state parameter comprises at least one of a state of charge (SOC), a charge health state (SOH) and a direct current resistance (DCR).

15. A battery management system, comprising: a battery monitoring chip, and
    a detection apparatus of electrochemical impedance spectroscopy, comprising:

a waveform generator, the waveform generator being integrated in the battery monitoring chip;

an excitation resistor; a detection resistor; and an MOS switch, wherein one of one end of the excitation resistor and one end of the detection resistor is connected to a positive electrode of a battery, the other of one end of the excitation resistor and one end of the detection resistor is connected to a negative electrode of the battery, one of the other end of the excitation resistor and the other end of the detection resistor is connected to a source electrode of the MOS switch, and the other of the other end of the excitation resistor and the other end of the detection resistor is connected to a drain electrode of the MOS switch;

wherein the waveform generator is configured to generate a pulse waveform, a gate electrode of the MOS switch is configured to receive the pulse waveform, the excitation resistor is configured to enable the battery to generate an excitation current when the gate electrode of the MOS switch receives the pulse waveform, the detection resistor is configured to convert the excitation current into an excitation voltage;

wherein the battery monitoring chip is configured to determine an electrochemical impedance of the battery according to the excitation voltage, pulse waveforms under different frequencies corresponds to different electrochemical impedances of the battery, and the different electrochemical impedances are configured to form electrochemical impedance spectroscopy of the battery.

16. The battery management system according to claim 15, wherein the MOS switch is integrated in the battery monitoring chip.

17. The battery management system according to claim 15, wherein the MOS switch is disposed outside the battery monitoring chip.

18. The battery management system according to claim 15, wherein an analog-to-digital converter in the battery monitoring chip is configured to sample the excitation voltage corresponding to the battery.

19. The battery management system according to claim 18, wherein the excitation voltage and an actual voltage of the battery during a using process are channel-switched to the analog-to-digital for being sampled by a multiplexer in the battery monitoring chip.

20. The battery management system according to claim 15, wherein the battery is a battery group formed by a plurality of battery cells in series connection;

the excitation resistor is configured to enable the battery group to generate an excitation current when the gate electrode of the MOS switch receives the pulse waveform; and the excitation resistor is configured to convert the excitation current into an excitation voltage, the excitation voltage is configured to determine calculate an electrochemical impedance of the battery group pulse waveforms under different frequencies corresponds to different electrochemical impedances of the battery, and the different electrochemical impedances are configured to form electrochemical impedance spectroscopy of the battery.

* * * * *